US012642146B2

(12) United States Patent
Chang Chien et al.

(10) Patent No.: US 12,642,146 B2
(45) Date of Patent: May 26, 2026

(54) PACKAGE STRUCTURE HAVING MULTIPLE REDISTRIBUTION LAYERS AND MANUFACTURING METHOD THEREOF

(71) Applicant: POWERTECH TECHNOLOGY INC., Hsinchu County (TW)

(72) Inventors: Shang-Yu Chang Chien, Hsinchu County (TW); Nan-Chun Lin, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 409 days.

(21) Appl. No.: 18/401,694

(22) Filed: Jan. 1, 2024

(65) Prior Publication Data

US 2024/0339443 A1 Oct. 10, 2024

(30) Foreign Application Priority Data

Apr. 10, 2023 (TW) ................................. 112113230

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 70/611* (2026.01);
(Continued)

(58) Field of Classification Search
CPC .. H10P 72/74; H10P 72/7424; H10P 72/7448; H10P 72/745; H10W 20/20; H10W 20/211; H10W 20/212; H10W 20/2125;

H10W 20/2128; H10W 20/213; H10W 20/2134; H10W 20/215; H10W 20/216; H10W 20/217; H10W 20/218; H10W 20/222; H10W 20/233; H10W 70/09; H10W 70/60; H10W 70/611;
(Continued)

(56) References Cited

U.S. PATENT DOCUMENTS

2020/0058626 A1* 2/2020 Tai .......................... H10P 72/74
2020/0411580 A1 12/2020 Hsu

FOREIGN PATENT DOCUMENTS

TW 202107643 A 2/2021
TW 202121597 A 6/2021

* cited by examiner

*Primary Examiner* — Cheung Lee
(74) *Attorney, Agent, or Firm* — Winston Hsu

(57) ABSTRACT

A package structure and a manufacturing method thereof are provided. The package structure includes a first package including a first redistribution layer, at least one chip and a second redistribution layer, and at least one second package disposed on the first package and including a substrate, an adhesive layer, at least two optical chips, an encapsulant layer, and a third redistribution layer. The optical chips are attached to a surface of the substrate close to the first package through the adhesive layer, and each optical chip has an optical surface close to the substrate. The encapsulant layer is disposed on the surface and surrounds the optical chips. The third redistribution layer is disposed between the encapsulant layer and the second redistribution layer, in which the second redistribution layer is electrically connected to the optical chips through the third redistribution layer.

20 Claims, 13 Drawing Sheets

(51) Int. Cl.
    *H10W 70/60*      (2026.01)
    *H10W 70/685*    (2026.01)
    *H10W 74/01*      (2026.01)
    *H10W 74/10*      (2026.01)
    *H10W 72/00*      (2026.01)

(52) U.S. Cl.
    CPC .........  *H10W 70/685* (2026.01); *H10W 74/01*
         (2026.01); *H10W 74/114* (2026.01); *H10W*
         *90/701* (2026.01); *H10W 90/734* (2026.01);
           *H10W 72/073* (2026.01); *H10W 90/724*
                          (2026.01)

(58) Field of Classification Search
    CPC ............. H10W 70/614; H10W 70/616; H10W
         70/685; H10W 70/686; H10W 70/687;
         H10W 72/072; H10W 72/073; H10W
          72/30; H10W 74/01; H10W 74/019;
         H10W 74/114; H10W 74/117; H10W
         90/00; H10W 90/701; H10W 90/724;
         H10W 90/725; H10W 90/726; H10W
                         90/734
    See application file for complete search history.

PACKAGE STRUCTURE HAVING MULTIPLE REDISTRIBUTION LAYERS AND MANUFACTURING METHOD THEREOF

BACKGROUND OF THE INVENTION

1. Field of the Invention

The present invention relates to a package structure and a manufacturing method thereof and particularly to a package structure having at least two optical chips and a manufacturing method thereof.

2. Description of the Prior Art

With the progress of chip packaging technology, the package structures have been developed toward miniaturization and high density. In a conventional package structure, a three-dimensional stack package technology has been developed for shrinking an area of the package structure. However, during a packaging process of stacking multiple chips, stresses between redistribution layers and between the redistribution layers and the encapsulant layer are easy to cause warpage of the package structure, so that it is difficult to control the flatness of the chip, thereby limiting the applications of the package structure.

SUMMARY OF THE INVENTION

According to an embodiment of the present invention, a package structure is provided and includes a first package and at least one second package. The first package includes a first redistribution layer, at least one chip, and a second redistribution layer. The chip is disposed on the first redistribution layer, and the second redistribution layer is disposed on the chip, in which the second redistribution layer is electrically connected to the first redistribution layer. The second package is disposed on the first package and includes a substrate, an adhesive layer, at least two optical chips, an encapsulant layer, and a third redistribution layer. The adhesive layer is disposed on a surface of the substrate close to the first package. The optical chips are attached to the surface of the substrate close to the first package through the adhesive layer, in which each of the optical chips has an optical surface close to the substrate. The encapsulant layer is disposed on the surface of the substrate close to the first package, and the encapsulant layer surrounds the optical chips. The third redistribution layer is disposed between the encapsulant layer and the second redistribution layer, in which the second redistribution layer is electrically connected to the optical chips through the third redistribution layer.

According to another embodiment of the present invention, a manufacturing method of a package structure is provided and includes forming at least one first package, forming at least one second package, and bonding the second package to the first package. The first package includes a first redistribution layer, at least one chip, and a second redistribution layer. The chip is disposed on the first redistribution layer, and the second redistribution layer is disposed on the chip, in which the second redistribution layer is electrically connected to the first redistribution layer. The step of forming the second package includes providing a substrate, attaching at least two optical chips to the substrate through an adhesive layer, forming an encapsulant layer on the substrate, and forming a third redistribution layer on the encapsulant layer and the optical chips. Each of the optical chips has an optical surface close to the substrate, and the encapsulant layer surrounds the optical chips. The third redistribution layer is electrically connected to the second redistribution layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
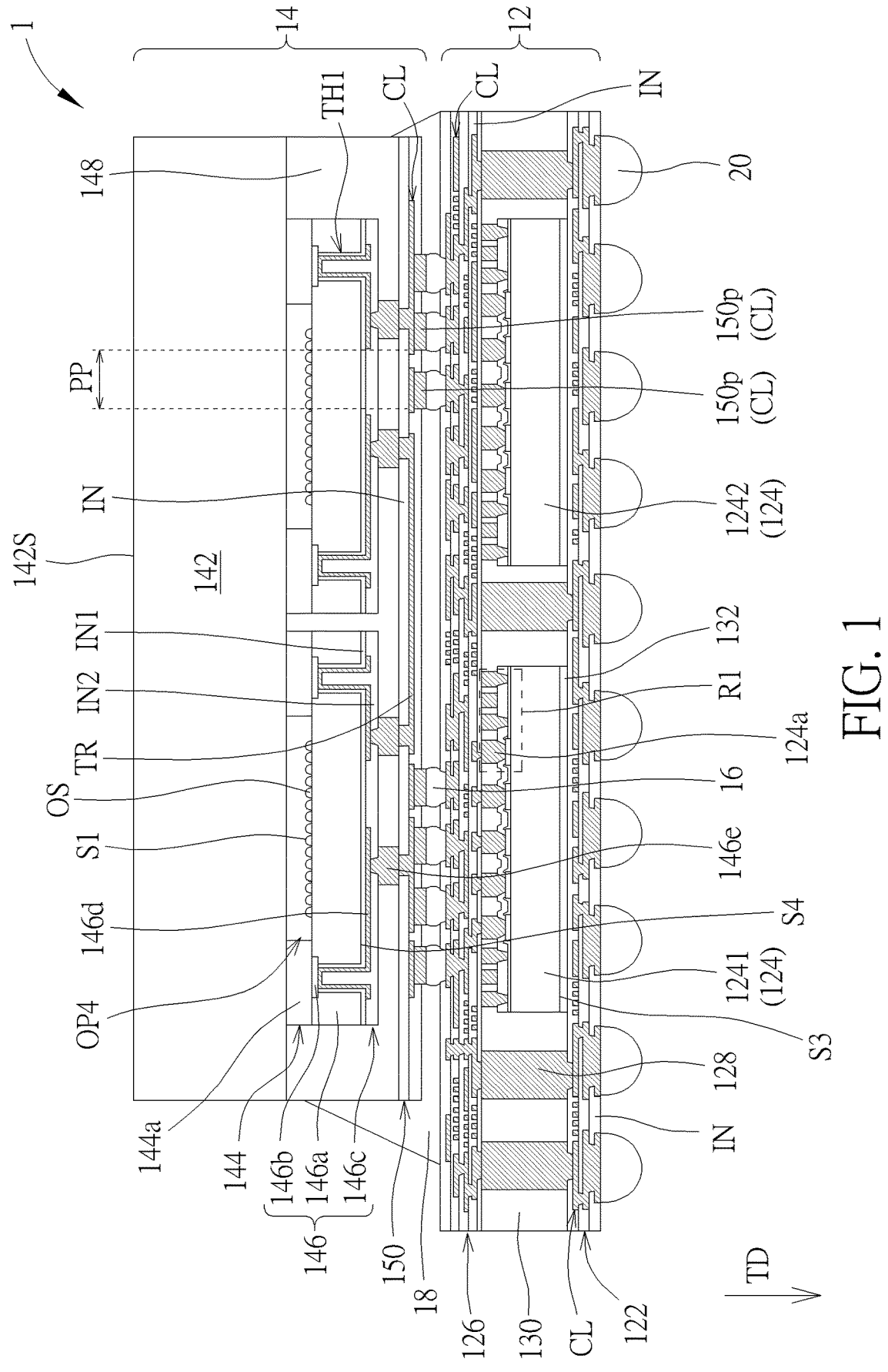
FIG. 1 schematically illustrates a cross-sectional view of a package structure according to a first embodiment of the present invention.

The contents of the present invention will be described in detail with reference to specific embodiments and drawings. It is noted that, for purposes of illustrative clarity and being easily understood by the readers, the following drawings may be simplified schematic diagrams, and components therein may not be drawn to scale. The numbers and sizes of the components in the drawings are just illustrative and are not intended to limit the scope of the present invention.

Spatially relative orientation terms, such as "above", "on", "beneath", "below", "under", "left", "right", "before", "front", "after", "behind" and the like, used in the following embodiments just refer to the directions in the drawings and are not intended to limit the present invention. It may be understood that components in the drawings may be disposed in any kind of formation known by those skilled in the related art to describe or illustrate the components in a certain way.

When one component or layer is "on" or "above" another component or layer, it may be understood that the component or layer is directly on the another component or layer, and alternatively, another component or layer may be between the one component or layer and the another component or layer (indirectly). On the contrary, when the component or layer is "directly on" the another component or layer, there is no intervening component or layer between the component or layer and the another component or layer.

As disclosed herein, when one component is referred to as being "electrically connected to" or "coupled to" another component, it will be understood that intervening components may be between the component and the another component and electrically connect the component to the another component, and alternatively, the component may be directly electrically connected to the another component without intervening components existing between them. If one component is referred to as being "directly electrically connected to" or "directly coupled to" another component, there are no intervening components present between them.

It should be understood that according to the following embodiments, features of different embodiments may be replaced, recombined or mixed to constitute other embodiments without departing from the spirit of the present disclosure.

Refer to FIG. 1, which schematically illustrates cross-sectional view of a package structure according to a first embodiment of the present invention. As shown in FIG. 1, the package structure 1 includes a first package 12 and at least one second package 14, and the second package 14 is disposed on the first package 12.

The first package 12 includes a first redistribution layer 122, at least one chip 124 and a second redistribution layer 126. The chip 124 is disposed on the first redistribution layer 122, and the second redistribution layer 126 is disposed on the chip 124, in which the second redistribution layer 126 is electrically connected to the first redistribution layer 122.

The second package 14 includes a substrate 142, an adhesive layer 144, at least two optical chips 146, an encapsulant layer 148, and a third redistribution layer 150. The adhesive layer 144 is disposed on a surface of the substrate 142 close to the first package 12, and the optical chips 146 are attached to the surface of the substrate 142 close to the first package 12 through the adhesive layer 144, in which each of the optical chips 146 has an optical surface S1 close to the substrate 142. The encapsulant layer 148 is disposed on the surface of the substrate 142 close to the first package 12 and surrounds the optical chips 146. The third redistribution layer 150 is disposed between the encapsulant layer 148 and the second redistribution layer 126, and the second redistribution layer 126 is electrically connected to the optical chips 146 through the third redistribution layer 150.

It should be noted that, since the optical chips 146 is attached to the substrate 142 through the adhesive layer 144, the optical chips 146 may be supported by the substrate 142, which helps to control or improve coplanarity of the optical surfaces S1 of the optical chip 146 during the manufacturing processes. In addition, since the encapsulant layer 148 surrounds the optical chips 146, the positions of the optical chips 146 may be fixed during the manufacturing processes, so as to improve the coplanarity of the optical surfaces S1.

The package structure 1 of this embodiment will be further described in detail below. As shown in FIG. 1, the second package 14 may be bonded and electrically connected to the first package 12, but not limited thereto. For example, the package structure 1 may further include a plurality of conductive terminals 16 disposed between the first package 12 and the second package 14 for bonding and electrically connecting the second package 14 to the first package 12. The second package 14 may be further bonded and electrically connected to other components, such as a circuit board, a package substrate, or other suitable components, through the first package 12. The conductive terminal 16 may, for example, include solder or other suitable materials. In some embodiments, the package structure 1 may include a plurality of second packages 14 disposed on the same first package 12, but not limited thereto.

In the package structure 1, each of the first redistribution layer 122, the second redistribution layer 126 and the third redistribution layer 150 may include at least one conductive layer CL and at least one insulating layer IN; for example, each of the first redistribution layer 122, the second redistribution layer 126 and the third redistribution layer 150 may include a plurality of conductive layers CL and a plurality of insulating layers IN, but not limited thereto. The conductive layers CL and the insulating layers IN may be alternately stacked to form the corresponding redistribution layer, so as to achieve the effect of redistributing circuits. In some embodiments, the numbers of the conductive layers CL, the circuit layouts and the numbers of the insulating layers IN of the first redistribution layer 122, the second redistribution layer 126 and the third redistribution layer 150 may be adjusted according to requirements.

In the embodiment shown in FIG. 1, the first package 12 may further include a plurality of conductive pillars 128 and an encapsulant layer 130 disposed between the first redistribution layer 122 and the second redistribution layer 126. The conductive pillars 128 may be used to electrically connect the first redistribution layer 122 to the second redistribution layer 126, so that the chip 124 electrically connected to the second redistribution layer 126 may be further electrically connected to the first redistribution layer 122 through the conductive pillars 128. In some embodiments, the conductive pillar 128 may, for example, include a single-layer or multi-layer structure. The conductive pillar 128 may include, for example, copper, nickel, tin, silver, other suitable materials, an alloy of at least two of the aforementioned, or a combination thereof, but not limited thereto. The encapsulant layer 130 may be disposed between the conductive pillars 128 and surrounds the chip 124 to protect the chip 124. The encapsulant layer 130 may include, for example, photosensitive encapsulant material, molding compound or other suitable encapsulant materials, but not limited thereto. The photosensitive encapsulant material may include siloxane polymer (such as SINR of Shin-Etsu Chemical), or other suitable organic materials. The molding compound may include, for example, epoxy or other suitable materials. In some embodiments, the encapsulant layer 130 may be, for example, a dry film type photosensitive encapsulant material and may be formed by a lamination process.

In this embodiment, the number of the chip 124 in the first package 12 may be plural, but not limited thereto. In this case, at least one of the chips 124 may include an active component, and at least another one of the chips 124 may include an active component, a passive component or a dummy chip, but not limited thereto. The active components may include, for example, transistors, diodes, integrated circuits, or other suitable components with gain, but not limited thereto. The chip 124 including the active components may be, for example, a controller chip, a power management integrated circuit (PMIC), a micro-electro-mechanical-system (MEMS) chip, an application-specific integrated circuit (ASIC) or other similar active chips, but not limited thereto. The passive components may be used to improve electrical performance, and for example, the passive component may include a capacitor, a resistor, an inductor, an integrated passive device (IPD), an integrated voltage regulator (IVR) or other suitable components. The dummy chip may be, for example, a non-functional or non-operational semiconductor chip or silicon die, but not limited thereto. For example, in FIG. 1, the chips 124 may include an active chip 1241 and a dummy chip 1242, in which the active chip 1241 is electrically connected to the second redistribution layer 126, but the dummy chip 1242 may be electrically insulated from the second redistribution layer 126, but not limited thereto. It should be noted that the installation of the dummy chip 1242 may improve the uniformity of semiconductor structure in the package structure 1, so as to reduce the unevenness of the encapsulant layer 130, thereby reducing the warpage of the package structure 1 and/or helping to control or reduce the warpage of the first package 12 during the manufacturing process. In some embodiments, the number of the chips 124 in the first package 12 may be adjusted according to the requirements. In this content, the chip may be referred to as a die, but not limited thereto.

Figure 2:
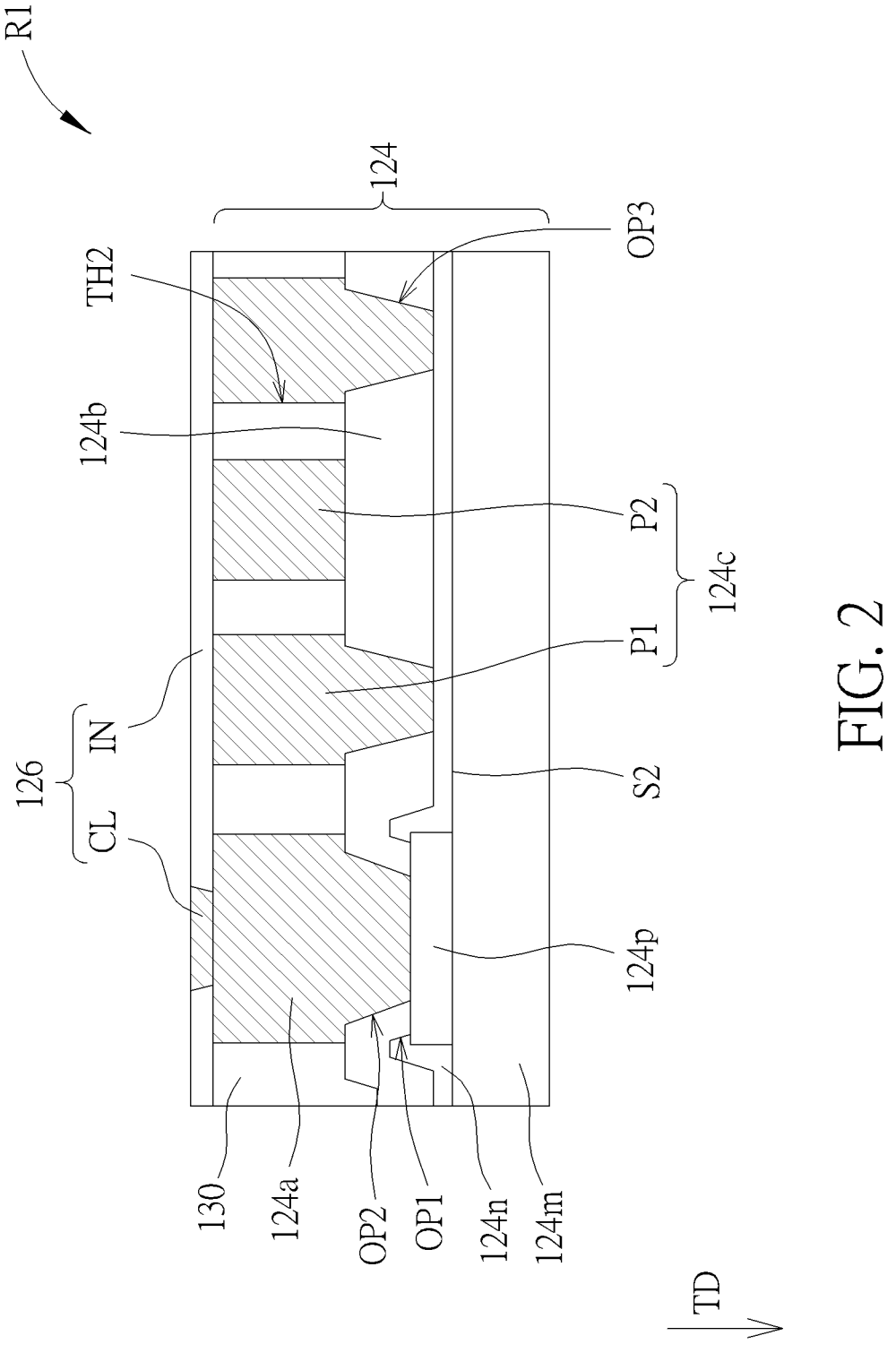
FIG. 2 schematically illustrates an enlarged view of a region R1 of the chip in FIG. 1.

Refer to FIG. 2, which schematically illustrates an enlarged view of a region R1 of the chip 124 in FIG. 1. As shown in FIG. 1 and FIG. 2, the chip 124 may include an active surface S2 close to the second redistribution layer 126, and the chip 124 is electrically connected to the second package 14 through the second redistribution layer 126 and the third redistribution layer 150. For example, the chip 124 may further include a chip body 124m, a plurality of pads 124p and an insulating layer 124n. The chip body 124m may have an active surface S2, and the pads 124p may be disposed on the active surface S2 of the chip body 124m. The insulating layer 124n may be disposed on the active surface S2 of the chip body 124m and the pads 124p, and the insulating layer 124n may have a plurality of openings OP1 respectively corresponding to the pads 124p. In the present embodiment, the chip 124 may include a plurality of conductive bumps 124a respectively formed on the pads 124p, but not limited thereto. The conductive bump 124a may include, for example, copper, tin, nickel, gold, lead or other suitable conductive materials, but not limited thereto. In this case, the chip 124 may further include a back surface S3 opposite to the active surface S2, and the first package 12 may further include an adhesive layer 132 for attaching the back surface S3 of the chip 124 to the first redistribution layer 122. The adhesive layer 132 may include, for example, a die attach film (DAF), a double-sided tape or other suitable materials, but not limited thereto. By disposing the active surface S2 of the chip 124 to face up and toward the second redistribution layer 126, a signal transmission distance between the chip 124 and the optical chips 146 may be reduced to improve operating efficiency of the package structure 1. In FIG. 2, the chip 124 may optionally include a protection layer 124b disposed between the insulating layer 124n and the conductive bumps 124a to protect the fragile insulating layer 124n during the manufacturing processes. The protection layer 124b may have a plurality of openings OP2 respectively corresponding to the openings OP1 of the insulating layer 124n to expose the corresponding pads 124p. The protection layer 124b may include polyimide (PI), polybenzoxazole (PBO) or other suitable materials.

In some embodiments, according to the material choice of the encapsulant layer 130, for example, when the encapsulant layer 130 includes the photosensitive encapsulant material, the chip 124 may optionally not include the conductive bumps 124a, such that the conductive layer CL of the second redistribution layer 126 closest to the chip 124 may be directly electrically connected to the pads 124p.

Figure 3:
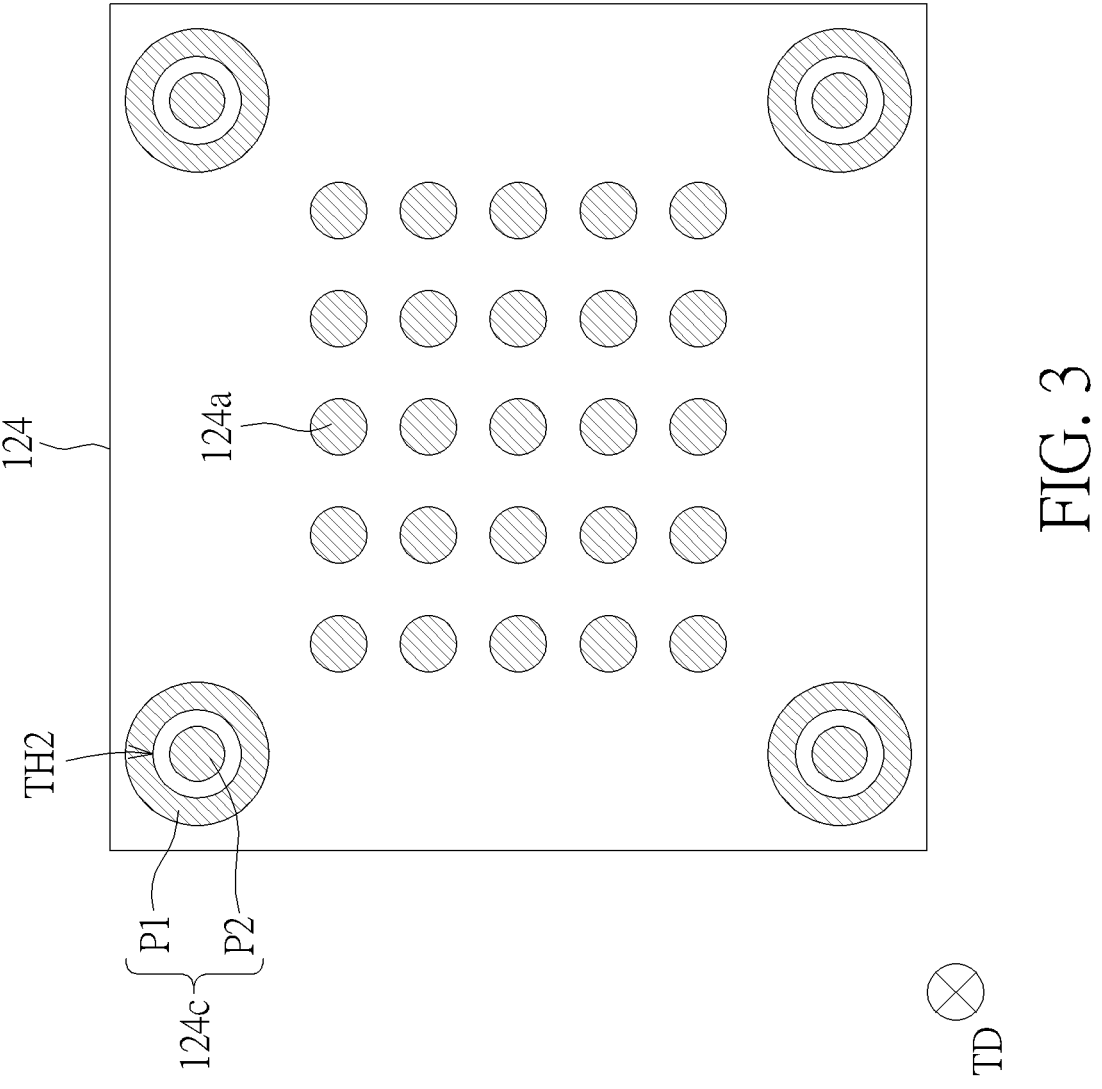
FIG. 3 schematically illustrates a top view of the conductive bumps and patterned bumps according to an embodiment of the present invention.

In some embodiments, the chip 124 may optionally further include at least one patterned bump 124c disposed on the insulating layer 124n. Refer to FIG. 3, which schematically illustrates a top view of the conductive bumps and patterned bumps according to an embodiment of the present invention. As shown in FIG. 2 and FIG. 3, each of the pattern bumps 124c may, for example, include an outer hollow metal pillar P1 and an inner solid metal pillar P2 separated from each other, in which the outer hollow metal pillar P1 has a through hole TH2, and the inner hollow metal pillar P2 is disposed in the through hole TH2. Moreover, the protection layer 124b may have an opening OP3 exposing the insulating layer 124n, and the outer hollow metal pillar P1 may be disposed in the opening OP3. The inner solid metal pillar P2 is disposed on the protection layer 124b, so that a lower surface of the outer hollow metal pillar P1 and a lower surface of the inner solid metal pillar P2 may be located in different planes, and an upper surface of the outer hollow metal pillar P1 and an upper surface of the inner solid metal pillar P2 may be located in the same plane.

Figure 4:
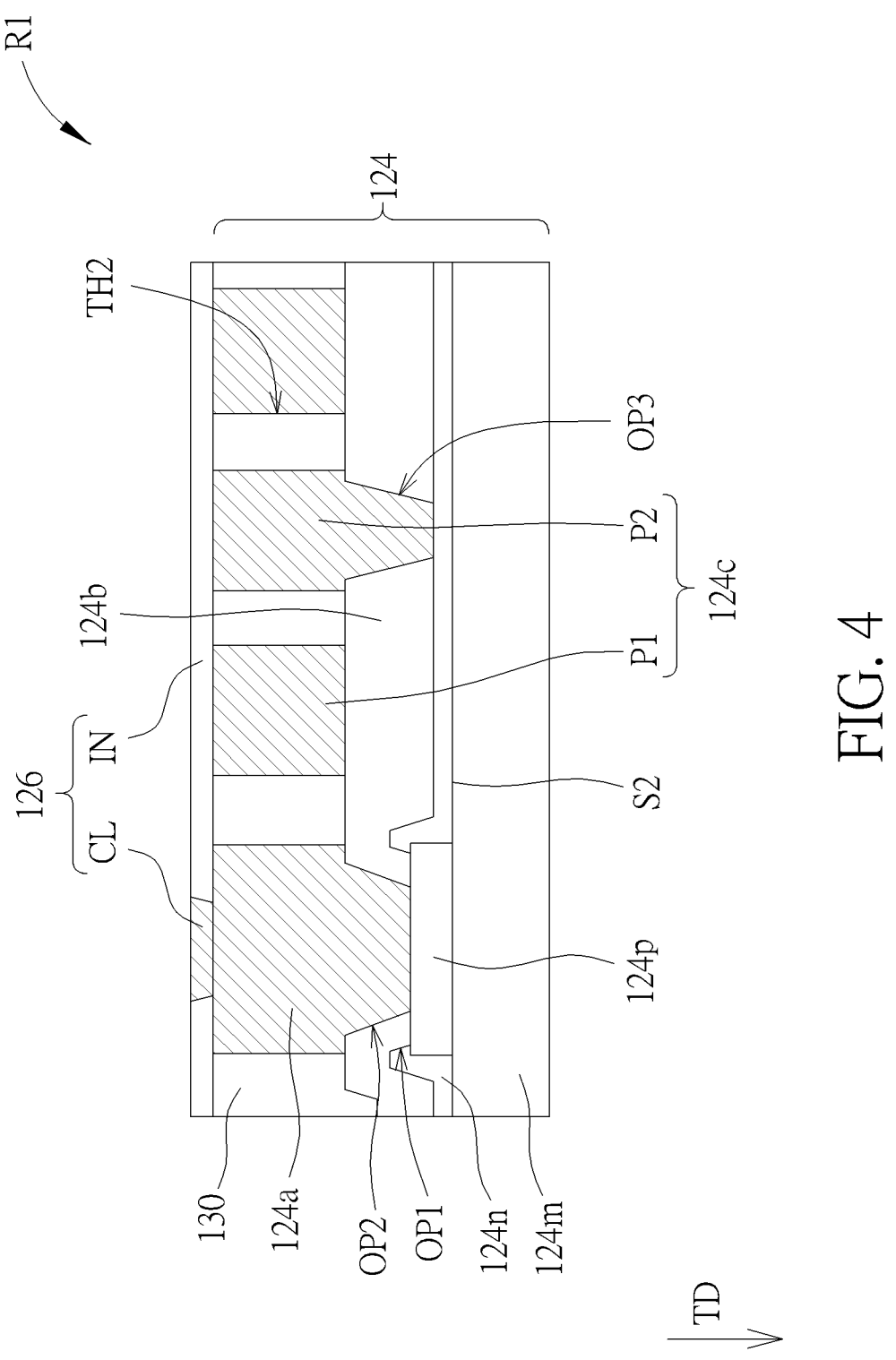
FIG. 4 schematically illustrates a top view of the conductive bumps and the patterned bumps according to some embodiments of the present invention.

Refer to FIG. 4, which schematically illustrates a top view of the conductive bumps and the patterned bumps according to some embodiments of the present invention. As shown in FIG. 2 and FIG. 4, in some embodiments, the inner solid metal pillar P2 may be further disposed in the opening OP3 of the protection layer 124b, and the outer hollow metal pillar P1 is disposed on the protection layer 124b, but not limited thereto.

Refer to FIG. 1 again. In the second package 14, the substrate 142 may be a rigid substrate for supporting the optical chips 146 and helping to control or reduce the warpage of the package structure 1, such that the package structure 1 has excellent process yield. In this embodiment, the substrate 142 may include a transparent substrate, so that the substrate 142 may have a high transmittance to visible light. Accordingly, the optical chips 146 may be allowed to emit or receive the visible light through the substrate 142. The substrate 142 may be, for example, glass or other suitable substrate materials. In some embodiments, the substrate 142 may have a high transmittance to invisible light or other electromagnetic waves with other wavelength band. In this case, the substrate 142 may optionally include an opaque substrate, but not limited thereto. As mentioned herein, the top view direction TD of the package structure 1 may be, for example, opposite to a normal direction of the surface 142S of the substrate 142 away from the optical chips 146, but not limited thereto.

The adhesive layer 144 may be used to attach the optical chips 146 to the substrate 142. In this embodiment, the adhesive layer 144 may, for example, include a plurality of blocks 144a spaced apart from each other. The blocks 144a may be used to be attached to the corresponding optical chips 146 respectively, such that each block 144a may surround the optical surface S1 of the corresponding optical chip 146 in the top view direction TD of the package structure 1. With this design, each block 144a of the adhesive layer 144 may prevent the encapsulant layer 148 from being disposed between the optical surface S1 and the substrate 142, thereby avoiding the encapsulant layer 148 affecting the operation of the optical chips 146.

In FIG. 1, each block 144a may have an opening OP4, which exposes the optical surface S1 of a corresponding one of the optical chips 146 in the top view direction TD of the package structure 1, and each opening OP4 may be greater than the optical surface S1 of the corresponding optical chip 146, such that the adhesive layer 144 does not affect the operation of the optical chips 146. In this case, the adhesive layer 144 may include a transparent or opaque adhesive material. It should be noted that a thickness of the adhesive layer 144 may be greater than a distance between the optical surface S1 of each of the optical chips 146 and the substrate 142, so that the optical surfaces S1 of the optical chips 146 may be separated from the substrate 142 to avoid damage to the optical surfaces S1. In some embodiments, the adhesive layer 144 may include an adhesive material with good transmittance, such as optical glue. In this case, one of the blocks 144a may not have the opening OP4, but may be disposed between the optical surface S1 of the corresponding optical chip 146 and the substrate 142.

The optical surface S1 of one of the optical chips 146 may be for example defined as a surface of the optical chip 146 for receiving light or emitting light. As an example, in FIG. 1, the optical chip 146 may include an optical structure OS, and an upper surface of the optical structure OS may be the optical surface S1, but not limited thereto. The optical structure OS may for example include at least one lens or other suitable structures. Since the substrate 142 is rigid, the optical surfaces S1 of the optical chips 146 attached to the substrate 142 may be substantially located in the same plane.

The optical chips 146 may include image sensors or light emitting components, for example. In this embodiment, the optical chips 146 include light emitting components as an example. In this case, the second package 14 may include at least three or more light emitting components, but not limited thereto. The number of optical chips 146 in the second package 14 may be adjusted according to the requirements. The optical chips 146 may for example include light source chips (e.g., light source IC), light emitting chips or other suitable light emitting components, and may generate light of different colors, that is, the optical surfaces S1 of the optical chips 146 may emit light of different colors. In some embodiments, the second package 14 may include three optical chips 146, such as a red light emitting component, a green light emitting component, and a blue light emitting component, so that the package structure 1 may generate white light and be used in a display device, but not limited thereto. Through the coplanarity of the optical surfaces S1, quality or resolution of displayed images may be improved.

As shown in FIG. 1, in this embodiment, each of the optical chips 146 may include a chip body 146a, at least one conductive pad 146b and a fourth redistribution layer 146c. The conductive pad 146b may be formed in the chip body 146a and adjacent to the adhesive layer 144. The chip body 146a may, for example, include a semiconductor component or a chip. The chip body 146a may have at least one through hole TH1 exposing the conductive pad 146b. Moreover, the fourth redistribution layer 146c may be disposed on a back surface S4 of the chip body 146a away from the optical surface S1 and electrically connected to the conductive pad 146b through the through hole TH1. Through the design of the through hole TH1, it is helpful to reduce a size of the second package 14 when viewed from the top view direction TD.

In the embodiment of FIG. 1, the fourth redistribution layer 146c may include at least one trace 146d and at least one conductive bump 146e, in which the trace 146d may be disposed on the back surface S4 of the chip body 146a, and the conductive bump 146e may be disposed on a surface of the trace 146d close to the first package 12. Furthermore, the fourth redistribution layer 146c may include an insulating layer IN1 and an insulating layer IN2. The insulating layer IN1 may be disposed on the back surface S4 of the chip body 146a and between the trace 146d and the chip body 146a to electrically insulating the trace 146d from components in the chip body 146a. The insulating layer IN1 may extend to the through hole TH1 and has an opening exposing the conductive pad 146b, such that the trace 146d may be electrically connected to the conductive pad 146b through the opening of the insulating layer IN1. The insulating layer IN2 may be disposed on surfaces of the insulating layer IN1 and the trace 146d close to the first package 12, and has an opening exposing a part of the trace 146d, so that the conductive bump 146e may be disposed on the trace 146d exposed by the opening of the insulating layer IN2 and be electrically connected to the trace 146d. It should be noted that the trace 146d in this embodiment may be conformally disposed on the insulating layer IN1 and sidewalls of the through hole TH1, and since the trace 146d directly contacts the conductive pad 146b, a conformal shape of the trace 146d may reduce stress on the conductive pad 146b. In some embodiments, the structure of the fourth redistribution layer 146c is not limited to the aforementioned and may include a plurality of conductive layers (such as the above-mentioned conductive layers CL) and a plurality of insulating layers (such as the above-mentioned insulating layer IN) stacked alternately.

As shown in FIG. 1, since the encapsulant layer 148 surrounds the optical chips 146, the optical chips 146 are firmly fixed on the substrate 142, thereby reducing shifts in positions of the optical chips 146 during the manufacturing processes. Moreover, a part of the encapsulant layer 148 may be further disposed between the third redistribution layer 150 and the fourth redistribution layers 146c of the optical chips 146 to protect circuits in the fourth redistribution layers 146c. A material of the encapsulant layer 148 may be the same as or similar to that of the above encapsulant layer 130 and may refer to the description of the encapsulant layer 130, so it will not be repeated herein.

As shown in FIG. 1, the third redistribution layer 150 is disposed on a surface of the encapsulant layer 148 close to the first package 12 and is electrically connected to the conductive bump 146e. The conductive terminals 16 may be disposed between the third redistribution layer 150 and the second redistribution layer 126 of the first package 12 and may bond and electrically connect the third redistribution layer 150 to the second redistribution layer 126. In the embodiment shown in FIG. 1, at least two optical chips 146 may be electrically connected to each other through the third redistribution layer 150. For example, the third redistribution layer 150 may include at least one trace TR electrically connecting the conductive bumps 146e of two of the optical chips 146 to each other, but not limited thereto. In some embodiments, the optical chips 146 may be independently electrically connected to the chip 124 respectively through traces insulated in the third redistribution layer 150 and the second redistribution layer 126, but not limited thereto.

It should be noted that, in the conventional first package, since the second redistribution layer close to the active surface needs to be electrically connected to the chip, the number of the conductive layers of second redistribution layer is much greater than that of the first redistribution layer away from the active surface. Therefore, the stresses on upper side and lower side of the chip are easily different due to the difference in number of the conductive layers, which easily resulting in warpage. However, in the first package 12 of this embodiment, since the second redistribution layer 126 is electrically connected to the optical chips 146 through the third redistribution layer 150, it is possible to transfer a part of the conductive layers CL of the second redistribution layer 126 to the third redistribution layer 150 so as to reduce the number of the conductive layers CL of the second redistribution layer 126. In this case, the stresses on the upper side and the lower side of the encapsulant layer 130 may be relatively balanced, such that the warpage of the first package 12 may be reduced to improve flatness of the second package 14 disposed on the first package 12, which helps to control or improve the coplanarity of the optical surfaces S1 of the optical chips 146. For example, the number of conductive layers CL of the second redistribution layer 126 may be greater than or equal to that of the first redistribution layer 122 or similar to that of the first redistribution layer 122, but not limited thereto.

In FIG. 1, the third redistribution layer 150 may include a plurality of pads 150*p* for being electrically connected to the conductive terminals 16, in which the pads 150*p* may be formed of the conductive layer CL of the third redistribution layer 150 closest to the second redistribution layer 126. In this embodiment, the package structure 1 may optionally further include an underfill layer 18 disposed between the first package 12 and the second package 14 and surrounding the conductive terminals 16 so as to improving bonding strength between the first package 12 and the second package 14. In this embodiment, the underfill layer 18 may further surround the second package 14, but not limited thereto. The underfill layer 18 may include, for example, a capillary underfill (CUF), a non-conductive film, or other suitable materials, but not limited thereto. It should be noted that when a pitch PP between the pads 150*p* is too small, for example, less than or equal to 200 micrometers (μm), widths of the pads 150*p* will be designed to be small. Accordingly, the conductive terminals 16 for bonding the second package 14 to the first package 12 also need to be small, so as to be unable provide enough bonding strength. In this case, the installation of the underfill layer 18 may compensate the lack of bonding strength, thereby improving reliability of the package structure 1. The pitch PP mentioned herein may be, for example, a sum of a width of one of the pads 150*p* and a distance between two adjacent pads 150*p*. In some embodiments, when the pitch PP between the pads 150*p* is large enough, for example, greater than or equal to 350 μm, the conductive terminals 16 may have larger sizes so as to provide sufficient bonding strength. In this case, the package structure 1 may optionally not include the underfill layer 18.

As shown in FIG. 1, the package structure 1 may optionally further include a plurality of conductive terminals 20 disposed on a side of the first redistribution layer 122 away from the second redistribution layer 126 and used for being bonded and electrically connected to other components. The conductive terminals 20 may, for example, include solder or other suitable material.

It should be noted that in the above-mentioned package structure 1, the optical chips 146 may be integrated with the chip 124 in the same structure while maintaining the coplanarity of the optical surfaces S1, so that under being controlled and driven by the chip 124, the optical chips 146 may have required optical effect, such as improving the quality of displayed images, thereby increasing applications of the package structure 1.

Figure 5:
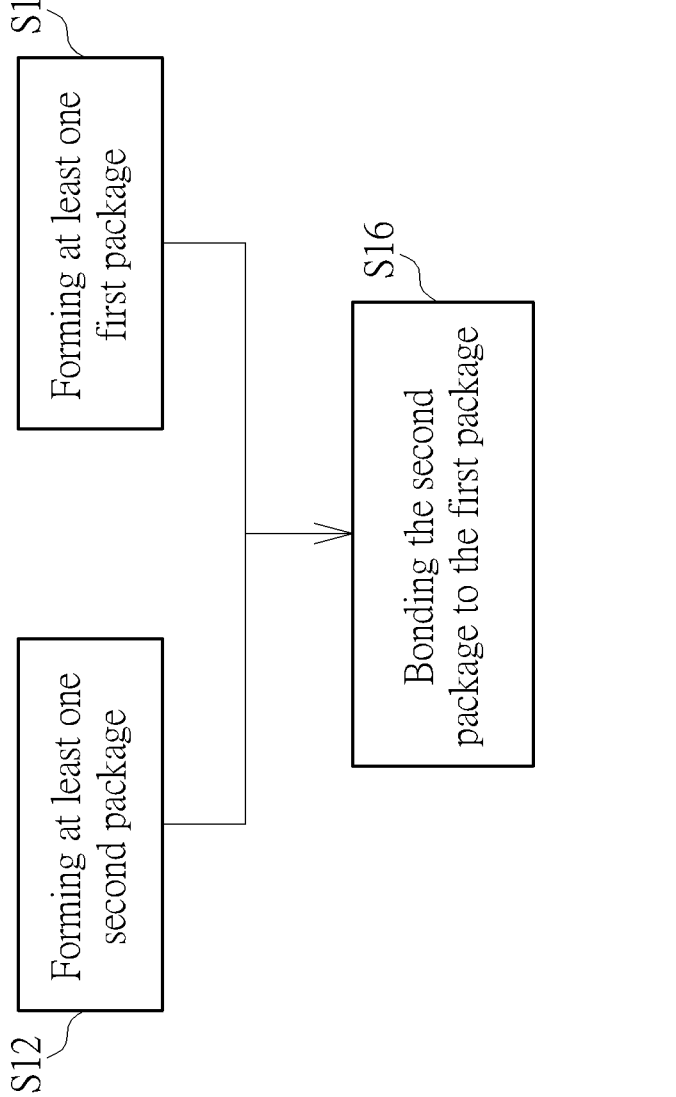
FIG. 5 schematically illustrates a flowchart of the manufacturing method of the package structure according to the first embodiment of the present invention.

A manufacturing method of the package structure of this embodiment is further described below. Refer to FIG. 5 to FIG. 11, in which FIG. 5 schematically illustrates a flowchart of the manufacturing method of the package structure according to the first embodiment of the present invention, and FIG. 6 to FIG. 11 schematically illustrate cross-sectional structures in different steps of the manufacturing method according to an embodiment of the present invention respectively. As shown in FIG. 5, the manufacturing method provided by this embodiment may, for example, include step S12 to step S16. First, in step S12, the second package 14 is formed, and in step S14, the first package 12 is formed. Next, step S16 is performed to bond the second package 14 to the first package 12. It should be noted that step S12 and step S14 do not interfere with each other, so that step S12 may be performed before or after step S14 or simultaneously with step S14. Step S12 to step S16 shown in FIG. 5 will be described in detail with reference to FIG. 1 and FIG. 6 to FIG. 11 below. In some embodiments, other steps may be performed before or after step S12 to step S16, between any two of step S12 to step S16, or at the same time as any one of step S12 to step S16.

Figure 6:
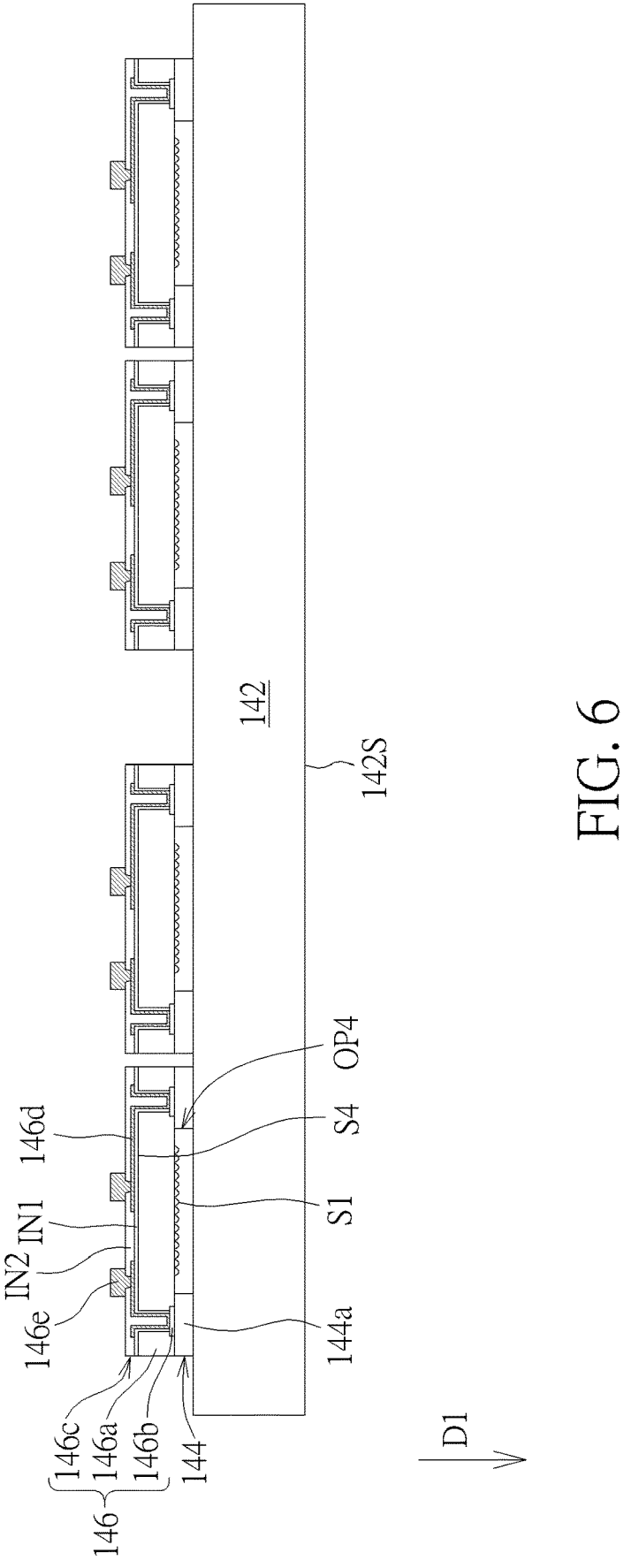
FIG. 6 to FIG. 11 schematically illustrate cross-sectional structures in different steps of the manufacturing method according to an embodiment of the present invention respectively.

Step S12 of forming the second package 14 may include following steps. As shown in FIG. 6, a substrate 142 is provided first, and then the optical chips 146 are attached to the substrate 142 through the adhesive layer 144. In this embodiment, between the steps of providing the substrate 142 and attaching the optical chips 146, the adhesive layer 144 may be formed on the substrate 142 first, and the adhesive layer 144 may be patterned to form a plurality of blocks 144*a*, so that each block 144*a* may surround the optical surface S1 of the corresponding optical chip 146 in a normal direction D1. The step of patterning the adhesive layer 144 may, for example, include exposure and development processes, a printing process or other patterning processes. The adhesive layer 144 may, for example, include a die attach film or other adhesive material capable of being patterned.

In the step of attaching the optical chips 146, the optical chips 146 may be disposed on the substrate 142 in a way that the optical surfaces S1 face the substrate 142, and when viewed along the normal direction D1 perpendicular to a surface 142S of the substrate 142 away from the adhesive layer 144, the optical surfaces S1 of the optical chips 146 may be respectively surrounded by the blocks 144*a* to reduce the influence of the adhesive layer 144 on the optical chips 146. It should be noted that, since the adhesive layer 144 may have a uniform thickness, and the adhesive layer 144 has a certain thickness, the optical surfaces S1 are separated from the substrate 142. In this case, the conductive bumps 146*e* of the optical chips 146 are located on the back surface S4 of the chip body 146*a* away from the optical surfaces S1.

Figure 7:
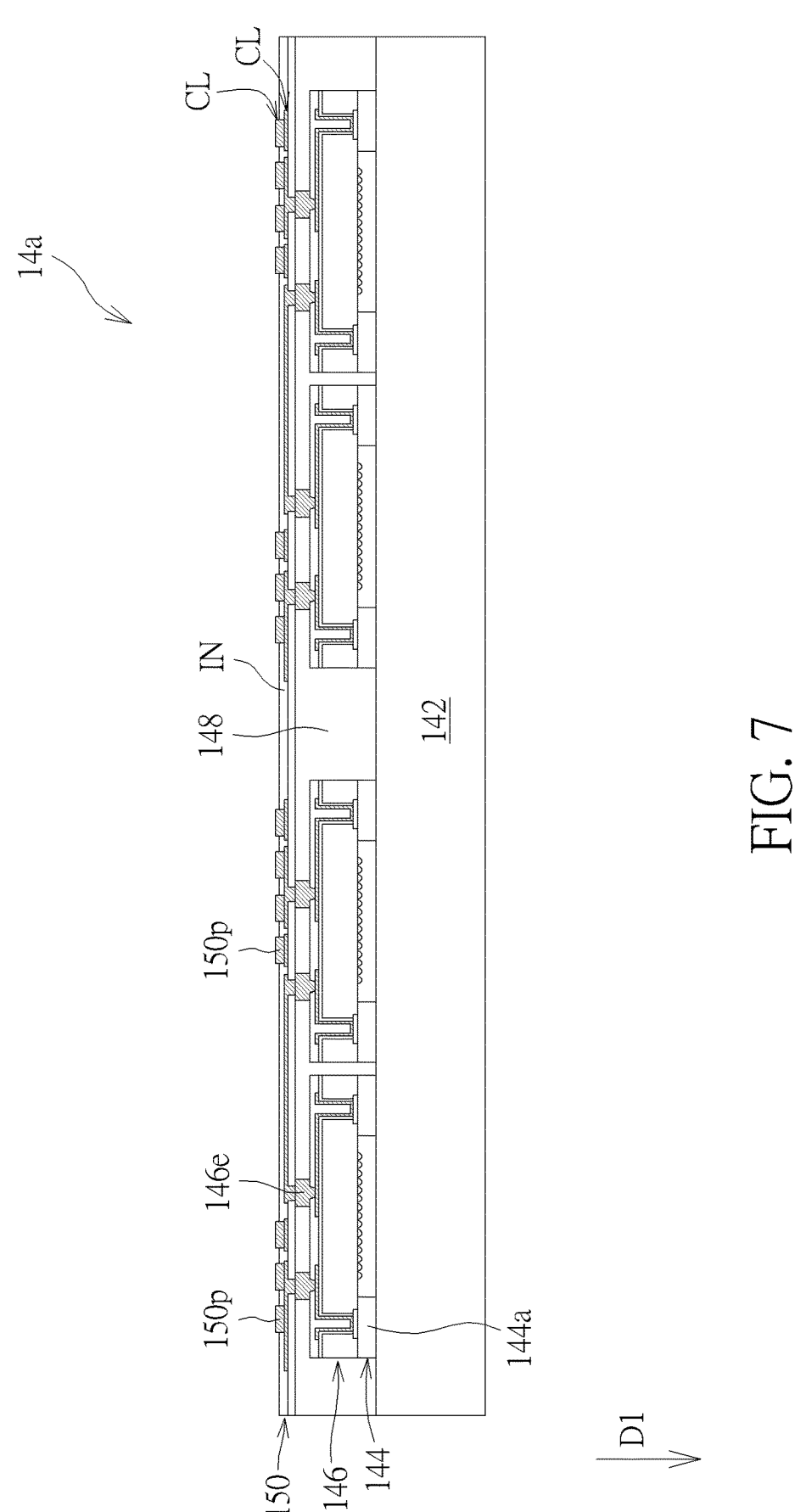

As shown in FIG. 7, after the optical chips 146 are attached, the encapsulant layer 148 is formed on the substrate 142, in which the encapsulant layer 148 surrounds the optical surfaces S1 of the optical chips 146. A method of forming the encapsulant layer 148 may include a molding process and a grinding process. During forming the encapsulant layer 148, a height of the encapsulant layer 148 may be greater than heights of the conductive bumps 146*e* first, and then the encapsulant layer 148 may be thinned by the grinding process to expose upper surfaces of the conductive bumps 146*e*. It should be noted that, since the conductive bumps 146*e* of the optical chips 146 protrudes from an upper surface of the insulating layer IN2 of the fourth redistribution layer 146*c* farthest from the optical surface S1, the conductive bumps 146*e* may be used as a stop layer of the grinding process, such that the grinding process may be controlled to be stopped after a part of the conductive bumps 146*e* is removed or the conductive bumps 146*e* are exposed, thereby preventing the insulating layer IN2 and the underlying trace 146*d* from damage. Furthermore, the thickness of the adhesive layer 144 is mainly to reduce or prevent the optical surfaces S1 of the optical chips 146 from being damaged due to contact with the substrate 142 and to prevent the encapsulant layer 148 from flowing onto the optical surfaces S1, so as to prevent the operation of the optical chips 146 from being affected.

After the encapsulant layer 148 is formed, the third redistribution layer 150 may be formed on the encapsulant layer 148 and the optical chips 146 to form a semi-finished structure 14*a*. The method of forming the third redistribution layer 150 may be, for example, alternately forming the insulating layers IN and the conductive layers CL. The third redistribution layer 150 may be electrically coupled to the conductive bumps 146e. In some embodiments, the uppermost conductive layer CL in the third redistribution layer 150 may include the pads 150p protruding from the upper surface of the uppermost insulating layer IN to facilitate boning with the following first package 12, thereby improving bonding reliability.

Figure 8:
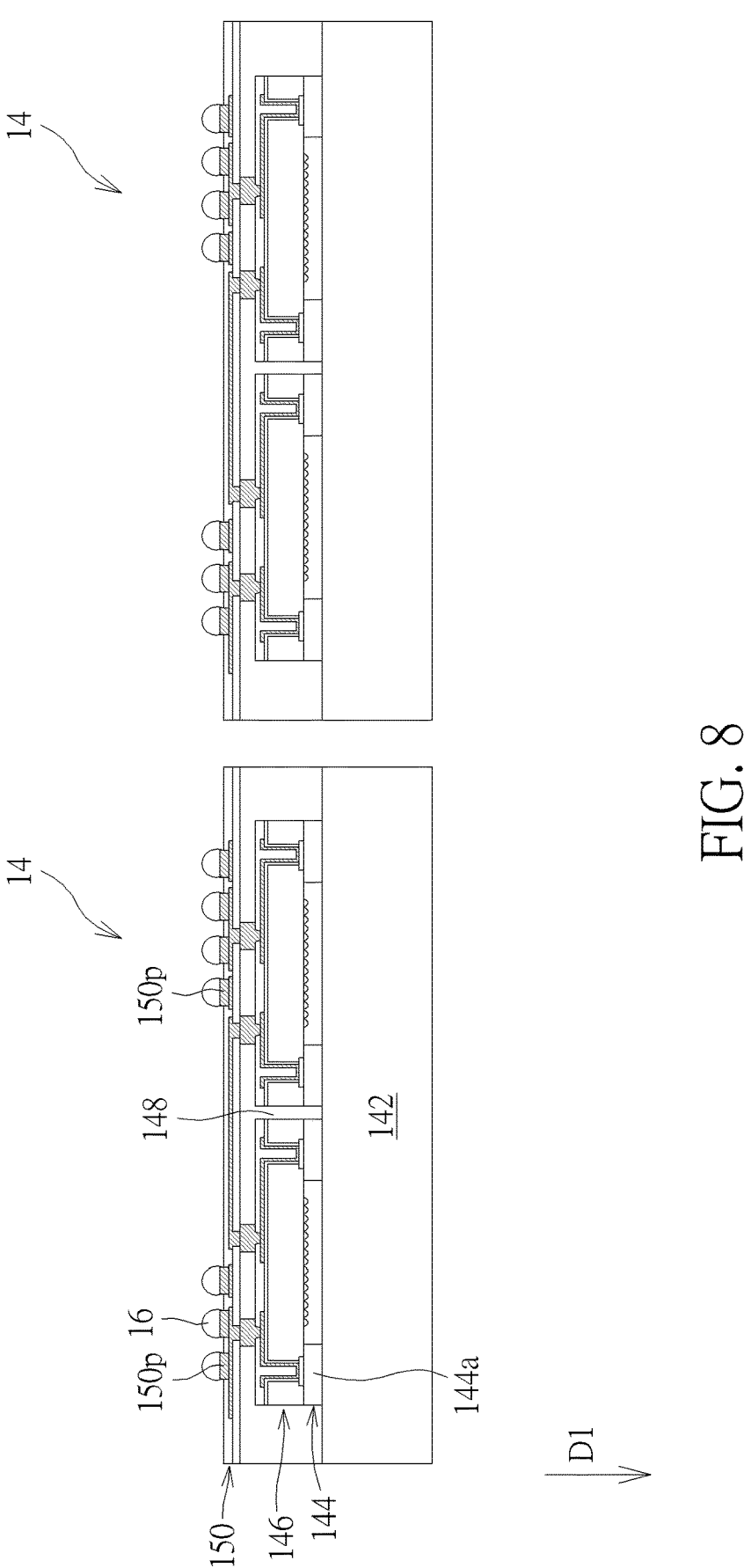

As shown in FIG. 8, a singulation process is performed on the semi-finished structure 14a to form a plurality of second packages 14. The singulation process may, for example, include a dicing process or other suitable processes. In this embodiment, before performing the singulation process, the conductive terminals 16 may be formed on the side of the third redistribution layer 150 away from the optical chips 146, for example, through a stencil ball mounting process, an electroplating process or other suitable methods, but not limited thereto. In some embodiments, the step of forming the conductive terminals 16 may be performed after the singulation process.

Figure 9:
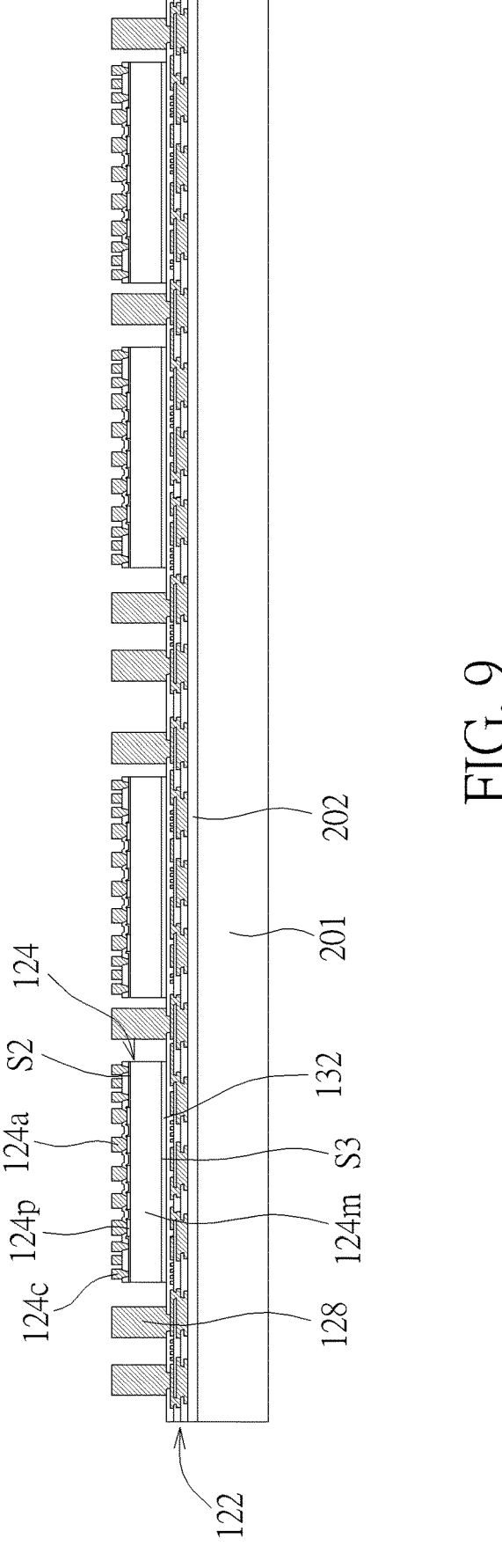

In addition, the step S14 of forming the first package 12 may include following steps. As shown in FIG. 9, a carrier 201 may be provided first. Then, the first redistribution layer 122 may be formed on the carrier 201, in which the method of forming the first redistribution layer 122 may include, for example, alternately forming the conductive layers CL and the insulating layers IN. In this embodiment, a release layer 202 may be on the carrier 201, and the first redistribution layer 122 is formed on the release layer 202, but not limited thereto.

After the first redistribution layer 122 is formed, the conductive pillars 128 may be formed on the first redistribution layer 122, and the chip 124 may be disposed on the first redistribution layer 122. In this embodiment, the step of disposing the chip 124 may include attaching the back surface S3 of the chip 124 to the first redistribution layer 122 through the adhesive layer 132. It is noted that before the chip 124 is disposed on the first redistribution layer 122, the conductive bumps 124a may be optionally formed on the pads 124p of the chip 124, so as to decrease damage to the pads 124p in subsequent processes.

Figure 10:
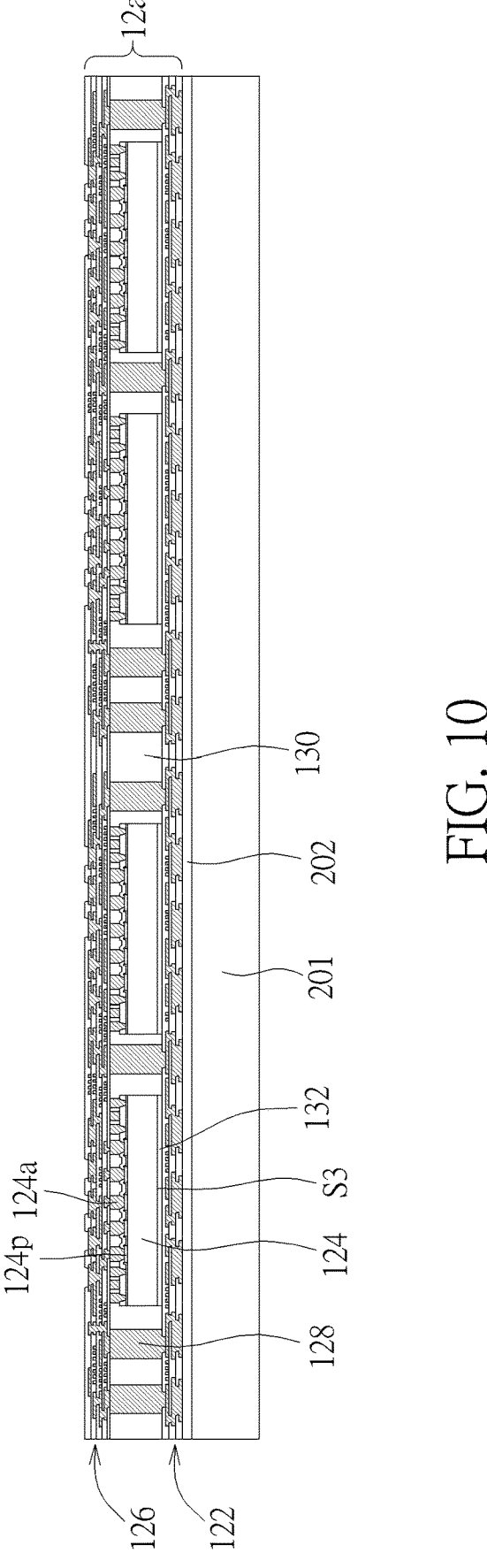

As shown in FIG. 10, after the chip 124 is disposed, the encapsulant layer 130 may be formed on the first redistribution layer 122, in which the encapsulant layer 130 surrounds the chip 124 and the conductive pillars 128. In this embodiment, during the formation of the encapsulant layer 130, the height of the encapsulant layer 130 may be higher than the height of the chip 124 and the conductive pillars 128 first, and then the encapsulant layer 130 is thinned through a grinding process to expose the upper surfaces of the conductive bumps 124a of the chip 124 and the upper surfaces of the conductive pillars 128.

In some embodiments, since the patterned bump 124c may be further disposed on the chip body 124m of the chip 124 (e.g., the specific structure shown in FIG. 2 to FIG. 4), during the step of thinning the encapsulant layer 130, a top view pattern of the patterned bump 124c may be inspected to determine whether the conductive bumps 124a are all exposed and leveled with each other or determine whether a depth of thinning the encapsulant layer 130 is too large to damage the pads 124p of the chip 124.

Next, after the encapsulant layer 130 is formed, the second redistribution layer 126 may be formed on the encapsulant layer 130, so that the semi-finished structure 12a including one or more first packages 12 may be formed. The second redistribution layer 126 may be electrically connected to the chip 124 and the conductive pillars 128.

The method of forming the second redistribution layer 126 may, for example, alternately form the insulating layers IN and the conductive layers CL. In some embodiments, the number of the conductive layers CL and/or the number of the insulating layers IN of the second redistribution layer 126 may be greater than or equal to that of the first redistribution layer 122 or similar to that of the first redistribution layer 122, so as to reduce warpage of the semi-finished structure 12a, but not limited thereto. In some embodiments, when the number of the conductive layers CL and/or the number of the insulating layers IN of the second redistribution layer 126 are greater than that of the first redistribution layer 122, the thickness of the first redistribution layer 122 may be increased to balance the stresses on the upper side and the lower side of the encapsulant layer 130 or control warpage. Alternatively, some conductive layers CL and/or insulating layers in the second redistribution layer 126 may be moved to the third redistribution layers 150.

Figure 11:
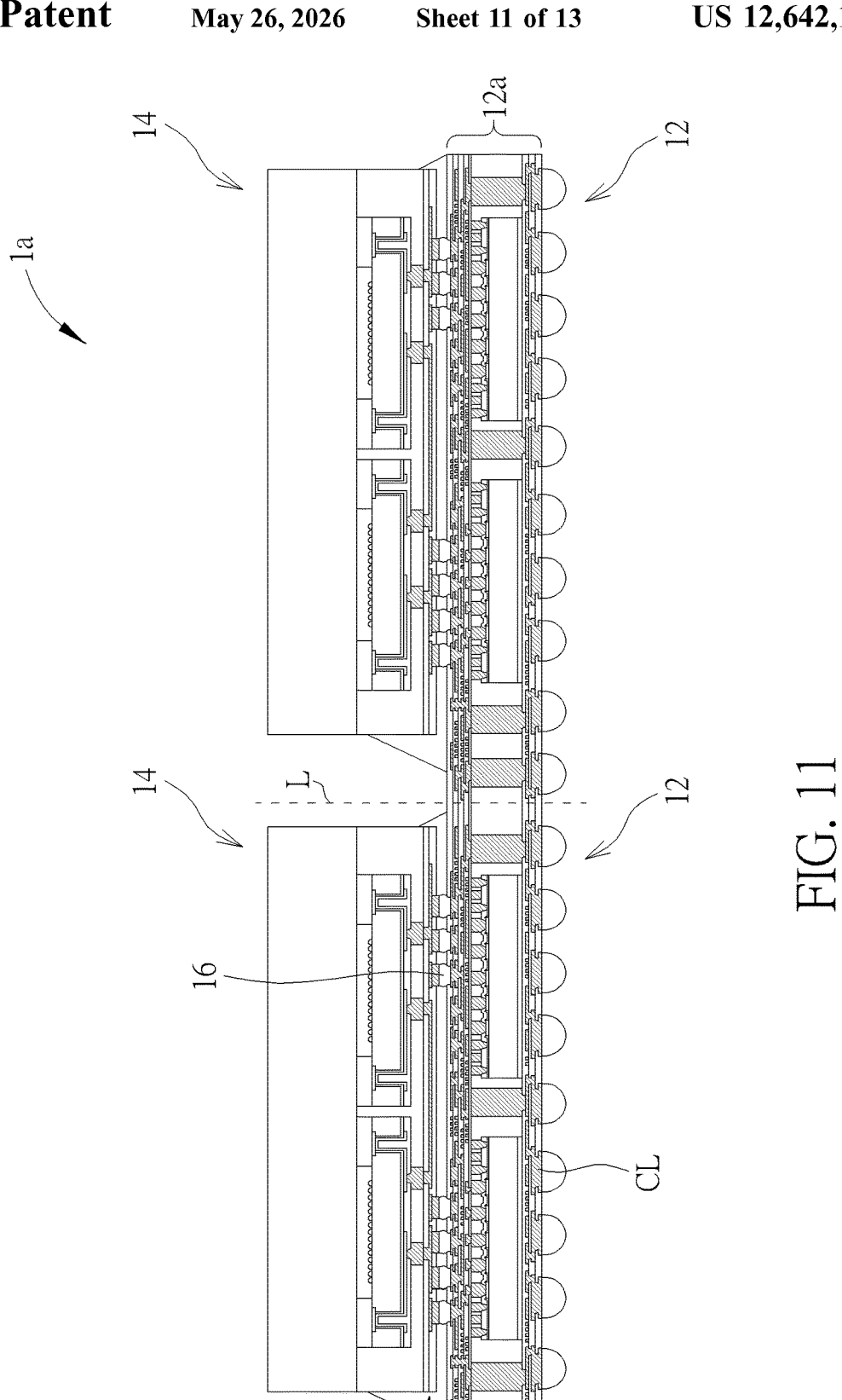

As shown in FIG. 11, in one embodiment, after the second redistribution layer 126 is formed, the carrier 201 and the release layer 202 under the semi-finished structure 12a may be removed first to expose the conductive layer CL of the first redistribution layer 122 farthest from chip 124. Then, the semi-finished structure 12a may be turned upside down as a whole, and the conductive terminals 20 are formed on the conductive layer CL of the first redistribution layer 122 farthest from the chip 124. The method of forming the conductive terminals 20 may include, for example, a stencil ball mounting process, an electroplating process, or other suitable processes. Next, the semi-finished structure 12a may be turned upside down again, and then step S16 is performed to bond at least one second package 14 on the first package 12. In this embodiment, a plurality of the second packages 14 may be bonded to the second redistribution layer 126 of the semi-finished structure 12a including a plurality of the first packages 12 to form a semi-finished structure 1a. In FIG. 11, a plurality of the second packages 14 may be bonded to the same semi-finished structure 12a, but not limited thereto. Further, in step S16, the third redistribution layers 150 of the second packages 14 may be bonded to the second redistribution layer 126 of the semi-finished structure 12a through the conductive terminals 16, so as to improve bonding strength between the second packages 14 and the first packages 12. In some embodiments, after step S16, the underfill layer 18 may be optionally formed between the second packages 14 and the semi-finished structure 12a. It should be noted that since the second packages 14 include the substrates 142, through the support of the substrates 142, warpage of the second packages 14 may be reduced when the second packages 14 are bonded to the first packages 12. Accordingly, the process yield of bonding the second packages 14 to the first packages 12 may be improved.

In the present invention, sequence of the step of removing the carrier 201 and the release layer 202 and step S16 of bonding the second packages 14 to the first packages 12 is not limited to the aforementioned. In some embodiments, after the carrier 201 and the release layer 202 are removed, step S16 may be performed first to bond the second packages 14 to the second redistribution layer 126 of the semi-finished structure 12a. After that, the semi-finished structure 12a bonded with the second packages 14 may be turned upside down, and the conductive terminals 20 are formed on the conductive layer CL of the first redistribution layer 122 farthest from the chip 124 to form the semi-finished structure 1a.

In some embodiments, after the second redistribution layer 126 is formed, step S16 may be performed first to bond the second packages 14 to the second redistribution layer 126 of the semi-finished structure 12a, and then the carrier 201 and the release layer 202 are removed. Next, the semi-finished structure 12a bonded with the second packages 14 is turned upside down, and the conductive terminals 20 are formed on the conductive layer CL of the first redistribution layer 122 farthest from the chip 124 to form the semi-finished structure 1a.

As shown in FIG. 11 and FIG. 1, after the semi-finished structure 1a is formed, a singulation process may be optionally performed to separate a plurality of the first packages 12 from each other along a dicing line (e.g., a dicing line L shown in FIG. 11) to form at least one package structure 1 including at least one second package 14. The singulation process may determine the size of the first package 12 according to the number of the second packages 14 required by the package structure 1. In some embodiments, the number of the second packages 14 in the package structure 1 is not limited as shown in FIG. 1, but may be multiple. In this case, the size of the first package 12 may be cut accordingly. The singulation process may, for example, include a blade sawing process, a laser cutting process or other suitable methods. In the embodiment of FIG. 11, since the semi-finished structure 1a may include at least two first packages 12, the singulation process may separate different first packages 12 to form at least two package structures 1, but not limited thereto. In some embodiments, when the semi-finished structure 12a is only used as the first package 12 of the single package structure 1, the singulation process does not need to be performed after the semi-finished structure 1a is formed, but not limited thereto.

In the above-mentioned manufacturing method of the package structure 1, since the optical chips 146 may be attached to the substrate 142 and fixed through the encapsulant layer 148, the coplanarity of the optical surfaces S1 of the optical chips 146 may be controlled and improved in the step of forming the second packages 14. Moreover, the rigidity of the substrate 142 may help to control the process yield of stacking the second packages 14 on the first package 12. In addition, through adjusting the number of the conductive layers CL of the second redistribution layer 126 and the number of the conductive layers CL of the third redistribution layer 150, it helps to balance the stresses on the upper side and the lower side of the encapsulant layer 130, thereby reducing the warpage of the first package 12.

The package structure and its manufacturing method of the present invention are not limited to the above-mentioned embodiment and may have other embodiments. To simplify the description, other embodiments below will use the same reference symbols as the above-mentioned embodiments to mark the same components. In order to easily compare the differences between the embodiments, the differences between the embodiments will be mentioned below, and the repeated parts will not be detailed.

Figure 12:
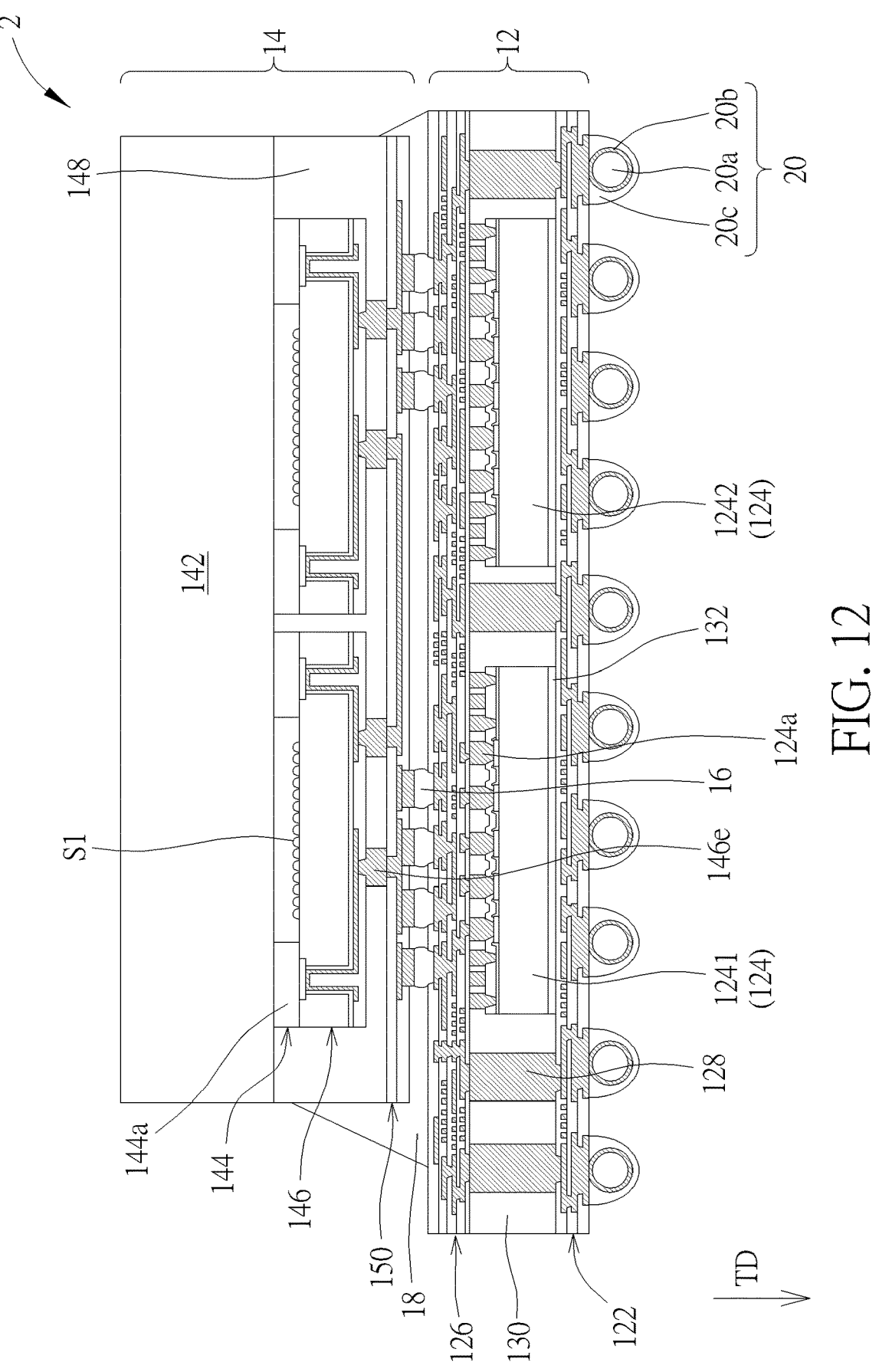
FIG. 12 schematically illustrates a cross-sectional view of a package structure according to a second embodiment of the present invention.

Refer to FIG. 12, which schematically illustrates a cross-sectional view of a package structure according to a second embodiment of the present invention. As shown in FIG. 12, the package structure 2 of this embodiment differs from the package structure 1 in FIG. 1 in that the conductive terminals 20 may include composite solder balls with a certain support, so that the conductive terminals 20 may maintain a uniform thickness after bonding. Through the composite solder balls, a uniform distance may be between the first package 12 and the bonded components, which helps to improve the flatness of the package structure 1, thereby improving the coplanarity of the optical surfaces S1 of different optical chips 146. For example, each of the conductive terminals 20 may include a core 20a and a metal layer 20b, and the metal layer 20b may cover the core 20a. A material of the core 20a may, for example, include polymer, copper or other suitable materials. For example, the core 20a may be a polymer core or a copper core. The polymer core may, for example, include microplastics or other suitable materials. Since the core 20a is supportive and will not melt during high temperature reflowing process, the conductive terminals 20 may maintain a consistent thickness. Moreover, the core 20a may provide buffer when the package structure 2 encounters an impact, and therefore, passing rate of drop test of the package structure 2 may be improved. The metal layer 20b may, for example, include copper, nickel or other suitable conductive materials. In addition, the conductive terminal 20 may further include a cover layer 20c surrounding the metal layer 20b, and the metal layer 20b is disposed between the core 20a and the cover layer 20c. The covering layer 20c may include solder for bonding and electrically connecting the first package 12 and the bonded components. Solder may, for example, include tin, silver, tin-silver alloys, or other suitable materials. Other parts of the package structure 2 of this embodiment may be the same as the package structure 1 described above and may refer to the contents mentioned above, so that they are not detailed redundantly.

It should be noted that since the conductive terminal 20 includes the core 20a, when the package structure 2 is bonded to other components, a thermal compression process and a curing process may be further performed, such that the distance between the package structure 2 and other bonded components may be fixed to be close to the thickness of the core 20a, thereby improving the coplanarity of the optical surfaces S1 after the package structure 2 is bonded to other components. Moreover, since the core 20a has elasticity, the stress caused by mismatch of thermal expansion coefficients may be mitigated, thereby improving the reliability of the package structure 2. Other steps in the manufacturing method of the package structure 2 of this embodiment may be the same as the above-mentioned manufacturing method of the package structure 1 and may refer to the contents mentioned above, so they are not detailed redundantly.

Figure 13:
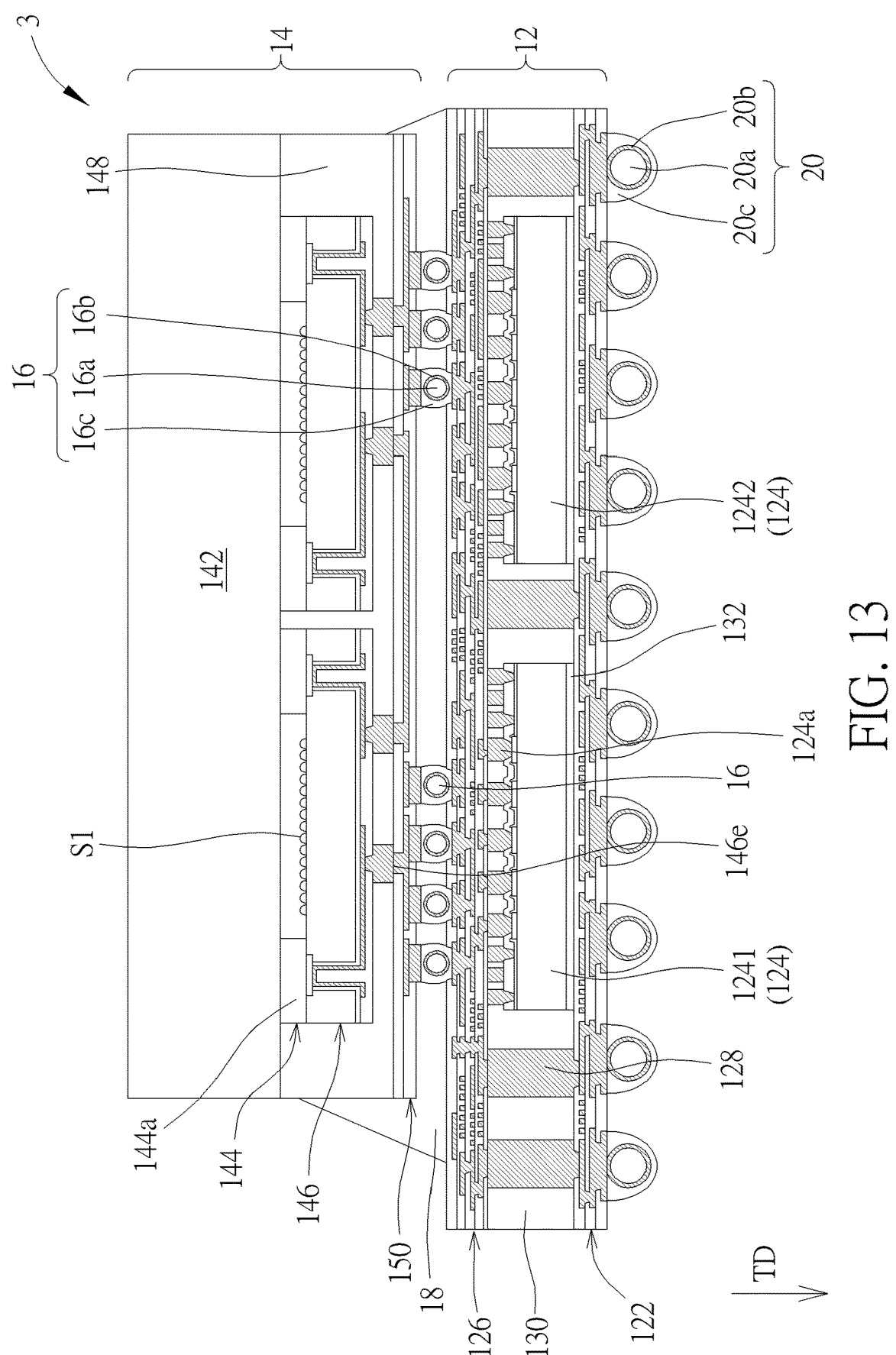
FIG. 13 schematically illustrates a cross-sectional view of a package structure according to a third embodiment of the present invention.

Refer to FIG. 13, which schematically illustrates a cross-sectional view of a package structure according to a third embodiment of the present invention. As shown in FIG. 13, the package structure 3 of this embodiment differs from the package structure 2 in FIG. 12 in that the conductive terminals 16 may include composite solder balls with certain support, so that the first package 12 and the second package 14 may have a uniform distance between them, which helps to enhance the flatness of the package structure 3, thereby improving the coplanarity of the optical surfaces S1 of different optical chips 146. The conductive terminal 16 may be the same as or similar to the conductive terminal 20 in FIG. 12 and may include a core 16a, a metal layer 16b and a cover layer 16c, in which the metal layer 16b may cover the core 16a, and the cover layer 16c may surround the metal layer 16b. Moreover, the conductive terminal 16 may have the same or similar function as the conductive terminal 20 and may refer to the contents mentioned above, so its details will not be repeated herein. The size of the conductive terminal 16 may be determined according to the size of the pad of the corresponding redistribution layer and may be for example the same as or different from the size of the conductive terminal 20. In this embodiment, the conductive terminal 20 may be the same as the conductive terminal 20 in FIG. 12, so it may refer to the contents mentioned above and will not be repeated herein. In some embodiments, in the case that the conductive terminal 16 includes the composite solder ball, the conductive terminal 20 may be different from the conductive terminal 20 of FIG. 12 and be formed of a solder ball, for example, the conductive terminal 20 shown in FIG. 1, but not limited thereto. Moreover, other parts of the package structure 3 of this embodiment may be the same as the above package structure 1 and may refer to the contents mentioned above, so they will not be repeated herein.

In the manufacturing method of the package structure 3 of this embodiment, the step of bonding the second package 14 to the first package 12 (or the semi-finished structure 12a shown in FIG. 11) may include disposing the second package 14 on the first package 12 and then performing a thermal compression process and a curing process to press the second package 14 toward the first package 12 and fix them. Since the conductive terminal 16 includes the core 16a, after the thermal compression process, the distance between the second package 14 and the first package 12 may be fixed to be close to the thickness of the core 16a, thereby improving the coplanarity of the optical surfaces S1.

In some embodiments, when the semi-finished structure 1a (as shown in FIG. 11) includes a plurality of the second packages 14, the second packages 14 may be disposed on the first package 12 first, and then, the thermal compression process and the curing process may be performed on the second packages 14 at the same time. Alternatively, the thermal compression process and the curing process may be performed a plurality of times, and the thermal compression process and the curing process of each time may be performed right after disposing a corresponding one of the second packages 14 on the first package 12, so as to bond the second packages 14 sequentially, but not limited thereto. Other steps in the manufacturing method of the package structure 3 of this embodiment may be the same as the manufacturing method of the package structure 1 described above and may refer to the contents mentioned above, so that they will not be detailed redundantly.

As mentioned above, in the manufacturing method of the package structure of the present invention, since the optical chips are attached to the substrate and fixed through the encapsulant layer, it is helpful to control the coplanarity of the optical surfaces of the optical chips in the step of forming the second packages. Moreover, through the rigidity of the substrate, it may be helpful to control the process yield of disposing the second packages on the first package. In addition, adjusting the number of the conductive layers of the second redistribution layer 126 and the number of the conductive layers of the third redistribution layer 150 may help to balance the stresses on the upper side and the lower side of the encapsulant layer surrounding the chip, thereby reducing the warpage of the first package. Accordingly, the coplanarity of the optical surfaces of the optical chips in the package structure may be improved or easily controlled. Furthermore, disposing the conductive terminals including the cores between the first package and the second package may further improve the coplanarity of the optical surfaces. In this way, the optical chips may be integrated with the chip in the same package structure while maintaining the coplanarity of the optical surfaces, so that the optical chips may have the required optical effect under being controlled and driven by the chip, thereby increasing the applications of the package structure 1 and improving the quality of its application products.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure, comprising:
a first package comprising:
  a first redistribution layer;
  at least one chip disposed on the first redistribution layer; and
  a second redistribution layer disposed on the chip, wherein the second redistribution layer is electrically connected to the first redistribution layer; and
at least one second package disposed on the first package, the second package comprising:
  a substrate;
  an adhesive layer disposed on a surface of the substrate close to the first package;
  at least two optical chips attached to the surface of the substrate close to the first package through the adhesive layer, wherein each of the optical chips has an optical surface close to the substrate;
  an encapsulant layer disposed on the surface of the substrate close to the first package, and the encapsulant layer surrounding the optical chips; and
  a third redistribution layer disposed between the encapsulant layer and the second redistribution layer, wherein the second redistribution layer is electrically connected to the optical chips through the third redistribution layer.

2. The package structure according to claim 1, wherein one of the optical chips comprises a chip body, at least one conductive pad and a fourth redistribution layer, the chip body has at least one through hole exposing the conductive pad, and the fourth redistribution layer is disposed on a back surface of the chip body away from the optical surface of the one of the optical chips and electrically connected to the conductive pad through the through hole.

3. The package structure according to claim 2, wherein the fourth redistribution layer comprises at least one trace and at least one conductive bump, the trace extends into the through hole, and the conductive bump is disposed on a surface of the trace close to the first package.

4. The package structure according to claim 3, wherein the third redistribution layer is electrically connected to the trace through the conductive bump.

5. The package structure according to claim 1, wherein the optical chips are electrically connected to each other through the third redistribution layer.

6. The package structure according to claim 1, wherein the encapsulant layer is disposed between the third redistribution layer and the optical chips.

7. The package structure according to claim 1, wherein a number of conductive layers of the second redistribution layer is greater than or equal to a number of conductive layers of the first redistribution layer.

8. The package structure according to claim 1, wherein the chip comprises an active surface close to the second redistribution layer, and the chip is electrically connected to the optical chips through the second redistribution layer and the third redistribution layer.

9. The package structure according to claim 1, further comprising a plurality of first conductive terminals disposed on a side of the first redistribution layer away from the second redistribution layer, each of the first conductive terminals comprises a core and a metal layer, and the metal layer covers the core.

10. The package structure according to claim 1, further comprising a plurality of second conductive terminals for bonding and electrically connecting the second package to the first package.

11. The package structure according to claim 1, wherein the adhesive layer comprises a plurality of blocks, and one of the blocks surrounds the optical surface of one of the optical chips in a top view direction of the package structure.

12. The package structure according to claim 1, wherein the optical surface of each of the optical chips is separated from the substrate.

13. The package structure according to claim 1, further comprising an underfill layer disposed between the first package and the second package.

14. The package structure according to claim 1, wherein the substrate comprises a transparent substrate.

15. A manufacturing method of a package structure, comprising:

forming at least one first package, wherein the first package comprises:

a first redistribution layer;

at least one chip disposed on the first redistribution layer; and a second redistribution layer disposed on the chip, wherein the second redistribution layer is electrically connected to the first redistribution layer;

forming at least one second package, comprising:

providing a substrate;

attaching at least two optical chips to the substrate through an adhesive layer, wherein each of the optical chips has an optical surface close to the substrate;

forming an encapsulant layer on the substrate, wherein the encapsulant layer surrounds the optical chips; and forming a third redistribution layer on the encapsulant layer and the optical chips; and bonding the second package to the first package, wherein the third redistribution layer is electrically connected to the second redistribution layer.

16. The manufacturing method of the package structure according to claim 15, further comprising forming the adhesive layer on the substrate and patterning the adhesive layer to form a plurality of blocks between providing the substrate and attaching the optical chips, wherein one of the blocks surrounds the optical surface of one of the optical chips.

17. The manufacturing method of the package structure according to claim 15, wherein one of the optical chips comprises a chip body and at least one conductive bump, and the conductive bump is disposed on a back surface of the chip body away from the optical surface of the one of the optical chips.

18. The manufacturing method of the package structure according to claim 17, wherein forming the encapsulant layer comprising performing a grinding process to expose the conductive bump.

19. The manufacturing method of the package structure according to claim 15, further comprising forming a plurality of first conductive terminals on a side of the first redistribution layer away from the second redistribution layer, wherein each of the first conductive terminals comprises a core and a metal layer, and the metal layer covers the core.

20. The manufacturing method of the package structure according to claim 15, further comprising forming a plurality of second conductive terminals on a side of the third redistribution layer away from the optical chips, wherein the third redistribution layer of the second package is bonded to the second redistribution layer of the first package through the second conductive terminals.

* * * * *